(12) United States Patent
Choy et al.

(10) Patent No.: US 6,909,638 B2
(45) Date of Patent: Jun. 21, 2005

(54) NON-VOLATILE MEMORY HAVING A BIAS ON THE SOURCE ELECTRODE FOR HCI PROGRAMMING

(75) Inventors: Jon S. Choy, Austin, TX (US); Gowrishankar L. Chindalore, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 48 days.

(21) Appl. No.: 10/426,282

(22) Filed: Apr. 30, 2003

(65) Prior Publication Data

US 2004/0218421 A1 Nov. 4, 2004

(51) Int. Cl.[7] ............................................. G11C 16/04
(52) U.S. Cl. ........................ 365/185.18; 365/185.19; 365/185.33
(58) Field of Search ....................... 365/185.18, 185.19, 365/185.33

(56) References Cited

U.S. PATENT DOCUMENTS

| | | | |
|---|---|---|---|
| 4,888,735 A | * 12/1989 | Lee et al. .............. | 365/185.19 |
| 5,923,585 A | * 7/1999 | Wong et al. ........... | 365/185.18 |
| 6,046,932 A | 4/2000 | Bill | |
| 6,275,415 B1 | 8/2001 | Haddad | |
| 6,285,589 B1 | * 9/2001 | Kajitani ................. | 365/185.19 |
| 6,381,177 B1 | * 4/2002 | De Sandre et al. ..... | 365/185.18 |
| 6,396,738 B1 | * 5/2002 | Tamada et al. ........ | 365/185.19 |
| 6,768,676 B2 | * 7/2004 | Hirano .................. | 365/185.18 |

* cited by examiner

Primary Examiner—Trong Phan
(74) Attorney, Agent, or Firm—James L. Clingan, Jr.; David G. Dolezal

(57) ABSTRACT

Each cell of a memory is programmed by first using a source bias that is typically effective for programming the cells. If a cell is not successfully programmed in the first attempt, that is typically because a number of cells on the same column as that of the cell that did not successfully program have a relatively low threshold voltage, a low enough threshold voltage that these memory cells are biased, even with grounded gates, to be conductive. The vast majority of the cells do not have this problem, but it is common for there to be a few memory cells that do have this low threshold voltage characteristic. To overcome this, a different source bias is applied during subsequent programming attempts. Thus, the vast majority of the cells are programmed at the faster programming condition, and only the few that need it are programmed using the slower approach.

29 Claims, 3 Drawing Sheets

NON-VOLATILE MEMORY HAVING A BIAS ON THE SOURCE ELECTRODE FOR HCI PROGRAMMING

FIELD OF THE INVENTION

This invention relates to non-volatile semiconductor memories, and more particularly, to non-volatile semiconductor memories that have a bias applied to the source electrodes of the memory array cells of the memory.

RELATED ART

Non-volatile memories are typically programmed using hot carrier injection (HCI) because it is significantly faster than the alternatives. An important aspect of HCI is that electrons are energized by current flow and that some of these electrons are sufficiently energized to jump to the storage layer that is above the channel where the current is flowing. Thus, programming is faster if there is more current (for a given field) and faster if a higher percentage of the electrons (for a given current) are sufficiently energized to reach the storage layer. A lower drain to source voltage has the doubly bad effect of both reducing current and reducing the percentage of electrons that have this sufficient energy. This can come about by deselected memory transistors that have too low of a threshold voltage and are conductive during programming of other cells in the same column. There is a certain amount of parasitic resistance in the current path for performing the programming that drops excessive voltage in the case where there is a number of memory transistors with the too-low threshold voltage in the same column. The programming voltage is generally provided by a power supply with limited capability, that is, one that has a fairly high output impedance. Thus, drawing relatively large currents can have the effect of loading down the supply to the point where the supply voltage is significantly reduced.

One approach has been to increase the source voltage to increase the threshold voltage and decrease the gate to source voltage. This has been effective but it also has the adverse effect of reducing the programming speed of the memory transistors that do not have the low threshold voltage problem, and thus in part losing the advantage of HCI programming.

Thus there is a need for improved speed of HCI programming when low threshold voltage devices are present.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect of the invention, a memory is programmed by first programming all of the cells with a source bias that is typically effective for programming the memory cells. If a cell was not successfully programmed in the first attempt, a different source bias is applied during subsequent programming attempts. This is better understood with respect to drawings and the following description.

Figure 1:
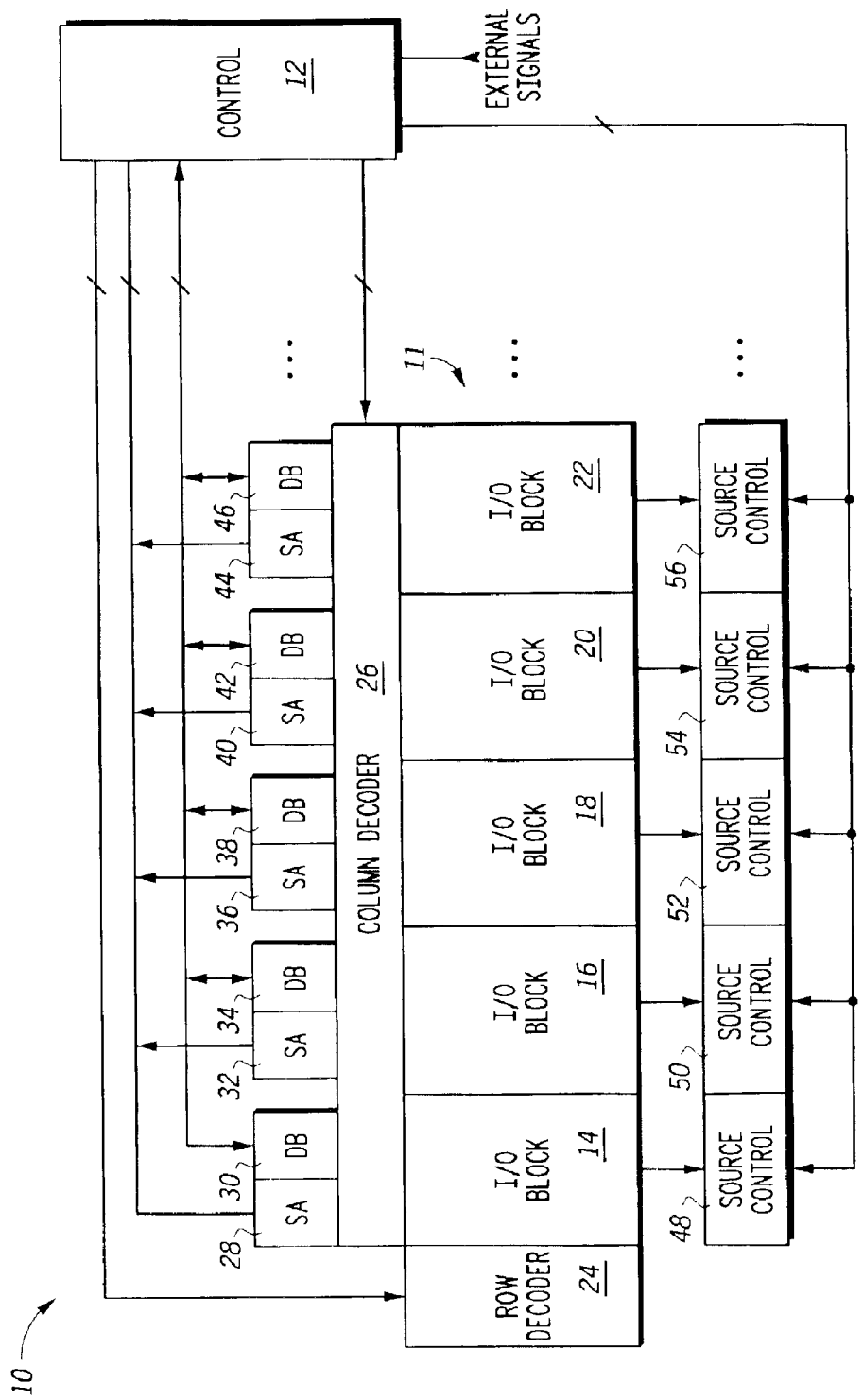
FIG. 1 is block diagram according to an embodiment of the invention.

Shown in FIG. 1 is a memory 10 having an array 11 of memory cells divided into I/O blocks 14, 16, 18, 20, and 22, a control circuit 12, a row decoder 24, a column decoder 26, a plurality of sense amplifiers (SAs in FIG. 1) 28, 32, 36, 40, and 44, a plurality of data buffers (DBs in FIG. 1) 30, 34, 38, 42, and 46, and a plurality of source control circuits 48, 50, 52, 54, and 56. Each memory cell is a non-volatile memory having a source, a control gate, a drain, and a floating gate. As an alternative, a different storage material may be used than a floating gate such as nitride or nanocrystals. Row decoder 24 enables a selected word line in I/O blocks 14–22 in response to a row address (not shown). Column decoder 26 couples, in response to a column address (not shown), selected bit lines present in I/O blocks 14–22 to respective sense amplifiers and data buffers, 28–46. These I/O blocks 14–22 are also coupled to source control circuits 48–56. Only five I/O blocks are shown for convenience, but in an actual memory many more such blocks, e.g., 64, would likely be present. In FIG. 1, source control 48, sense amplifier 28, and data buffer 30 correspond to I/O block 14; source control 50, sense amplifier 32, and data buffer 34 correspond to I/O block 16; source control 52, sense amplifier 36, and data buffer 38 correspond to I/O block 18; source control 54, sense amplifier 40, and data buffer 42 correspond to I/O block 20; and source control 56, sense amplifier 44, and data buffer 46 correspond to I/O block 22. Control circuit 12 is coupled to source control circuits 48–56, column decoder 26, row decoder 24, and sense amplifiers and data buffers 28–46.

Figure 2:
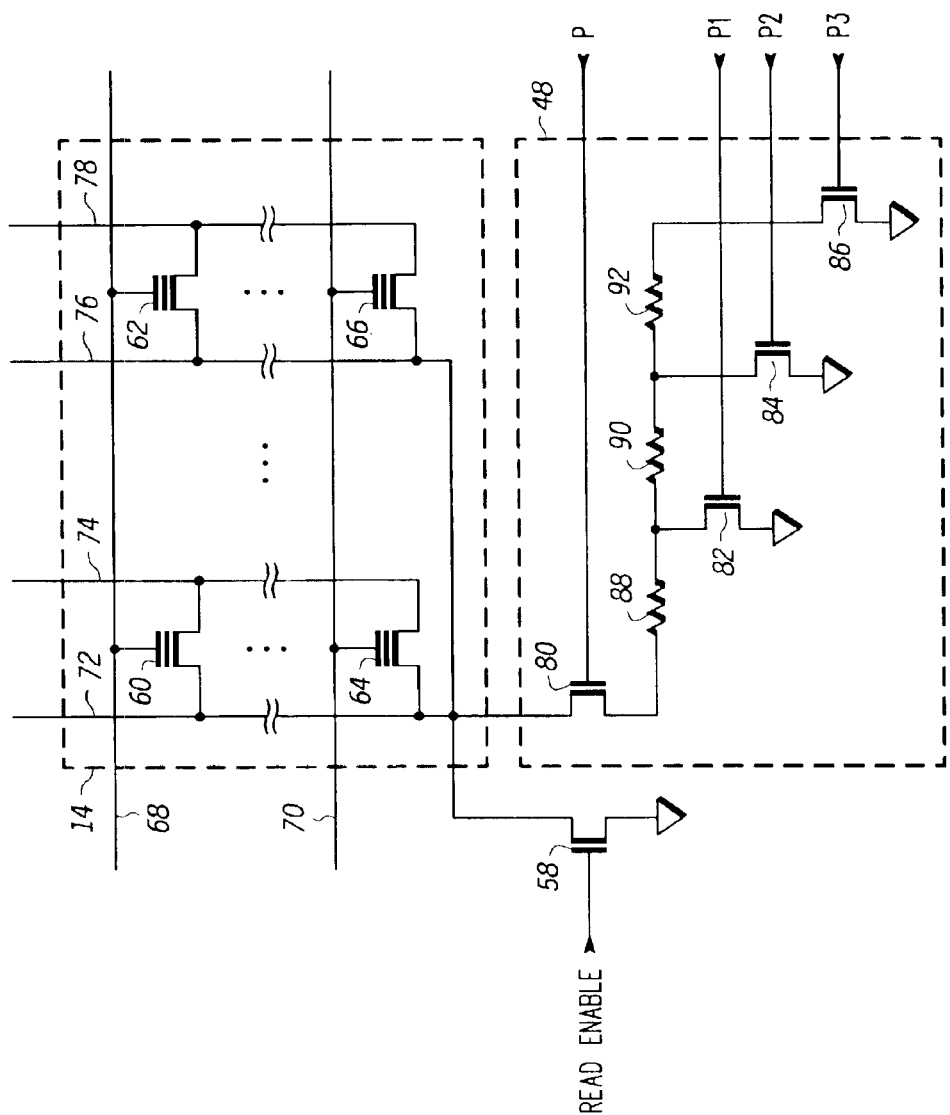
FIG. 2 is a circuit diagram of a portion of the block diagram of FIG. 1.

Shown in FIG. 2 is a portion of memory 10 of FIG. 1. In particular a portion of I/O block 14, source control circuit 48, and a transistor 58 are shown in FIG. 1. The portion of I/O block shown in FIG. 1 comprises memory cells 60, 62, 64, and 66; bit lines 74 and 78; and source lines 72 and 76. Source control circuit 48 comprises transistors 80, 82, 84, and 86 and resistors 88, 90, and 92. The drains of memory cells 60 and 64 are connected to bit line 74. The drains of memory cells 62 and 66 are connected to bit line 78. The sources of memory cells 60 and 64 are connected to source line 72. The sources of memory cells 62 and 66 are connected to source line 76. The control gates of memory cells 60 and 62 are connected to word line 68. The control gates of memory cells 64 and 66 are connected word line 70. As shown in FIG. 2, source lines 72 and 76 are connected together. All of the sources of the memory cells of memory array 11 are connected together.

In further describing FIG. 2, transistor 80 has a drain connected to source lines 72 and 76, a gate connected to a program signal P, and a source. Resistor 88 has a first terminal connected to the source of transistor 80 and a second terminal. Transistor 82 has drain connected to the second terminal of resistor 88, a source connected to ground, and a gate for receiving a program signal P1. Resistor 90 has a first terminal connected the second terminal of resistor 88 and a second terminal. Transistor 84 has a drain connected to the second terminal of resistor 90, a source connected to ground, and a gate for receiving a program signal P2. Resistor 92 has a first terminal connected to the second terminal of resistor 90 and a second terminal. Transistor 86 has a drain connected to the second terminal of resistor 92, a source connected to ground, and a gate for receiving a program signal P3. Transistor 58 has a drain connected to source lines 72 and 76, a source connected to ground, and a gate for receiving a READ ENABLE signal. Transistor 58 is a representative one of many transistors that are part of array 11 connected to source lines at other locations in memory array 11 for coupling the source lines to ground during a read operation of memory 10. The READ ENABLE signal and signals P, P1, P2, and P3 are generated by control circuit 12.

Figure 3:
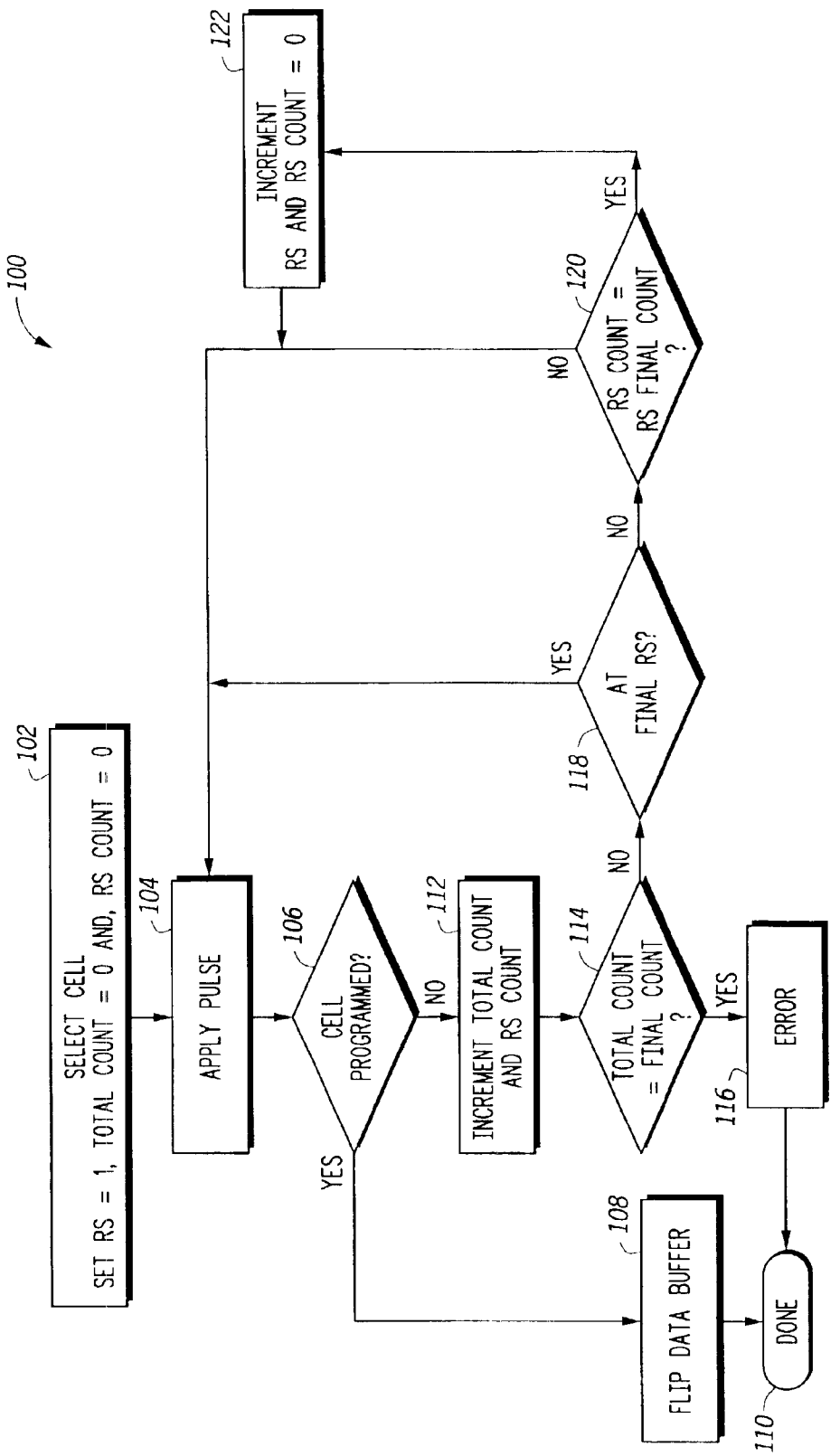
FIG. 3 is a flow chart of a method of the invention.

Shown in FIG. 3 is a flow chart of a method 100 for operating the memory of FIGS. 1 and 2 to achieve effective programming comprising steps 102, 104, 106, 108, 110, 112, 114, 116, 118, 120, 122. As shown in step 102, the process begins by selecting a cell to be programmed and initializing certain settings. One of the settings is initial setting for the total number of programming cycles that have been performed. At the beginning no cycles have been performed so Total Count is set to 0 (zero). In this process, multiple programming cycles will use different resistances that may be incremented in steps so that each step in resistance is designated RS. The first resistance to be used is set so RS=1 is the initial setting for RS. Also there will be a set number of maximum programming cycles for each resistance step. At the beginning there have been no programming cycles for any steps including the first step so that RS Count=0 as the initial setting. In actual operation, simultaneously with one cell being selected for programming many other cells will also be selected, typically one cell from each of the I/O blocks, and in this case, as many as 64. Of the 64, only those that are being changed from the erase state are programmed. Thus, many cells of the 64 are likely to be intended to stay in the erased state, typically considered the one (1) state as distinct from the programmed stated being considered the zero (0) state. Also, some of the cells that are intended to be in the "0" state may already be in that state. Thus, for any given programming cycle, the actually programming can be anywhere from no memory cells to 64 memory cells. The case of none being programmed occurs when all of the cells were already in the condition that was to be written. The condition of all 64 cells being programmed occurs when all of the memory cells were in the erased (one) state and an all zeros condition is to be written.

After it has been determined that the particular cell, such as cell 60 of FIG. 2, needs to be programmed and the initial conditions are set, a pulse is applied to the drain, via bit line 74, of that cell while its gate, via word line 68, is also at an elevated voltage. Typical voltages for the word line and drain in floating gate memories is about 9 volts and 5 volts, respectively. These voltages are likely to decrease as semiconductor technology improvements continue to result in smaller and smaller dimensions for channel lengths and gate dielectrics. During the application of the pulse to bit line 74, transistors 84 and 86 are non-conductive. Control logic 12 supplies signals P and P1 at a logic high and signals P2 and P3 at a logic low under these initial conditions. The READ ENABLE signal 58 is held at a logic low for programming so that transistor 58 is non-conductive during programming. This has the effect of the resistor 88 being in series with the sources of entire array. This resistor is a relatively low resistance, e.g., 250, ohms so that relatively little voltage is dropped across this resistor and thereby not greatly elevating the source voltage. This is effective for fully programming memory cell if the other memory cells connected to bit line 74 do not have too much leakage. If the other cells, such as memory cell 64, do have significant leakage, that will have the effect of reducing the voltage applied to bit line 74 because of the loading of the power supply and of the parasitic resistance that is associated with I/O block 14.

The next step then, step 106, is to determine if cell 60 has been in fact programmed. Sense amplifier 28, under the control of control circuit 12, detects the state of cell 60 so that control circuit 12 can determine if the programming of cell 60 was sufficient. If it was, then data is flipped in data buffer 30 as shown in step 108, and the programming is done as shown in step 110. If, on the other hand, cell 60 is not considered to be programmed, the total count is incremented and the RS count is incremented as shown in step 112. Then the total count of program cycles, step 114, is compared to the maximum allowed number of program cycles. Of course, the first time the criterion of this step 114 is addressed it will not be met, so the answer is no, and the next step would be step 118. If, after additional programming cycles, this criterion of step 114 is met, then that is considered an error and programming cycle is done. If this were to be done at the test level before the product was actually sold, this would be considered a failure and the device would be rejected. Control logic 12 has all the information necessary for making this decision.

For the case in which the criterion of step 114 is not met, then there is then performed a determination if the present RS is the last RS, as shown in step 118. If it is the last RS, then the next step is to perform another programming step. If the present RS is not the last step, then the next step, step 120, is to determine if the maximum number of steps at that RS level has been performed. In this case of the first time addressing this issue, the first step is likely to be the only step which uses the first resistance step, the resistance of resistor 88. Thus the number of programming steps at RS=1 is likely to be just one. Thus, the RS Count of 1 would match the RS Final number, likely to be one. In such case the next step is step 122. In other circumstances where the number of programming steps at that RS level had not been reached, the next step would be to performing another programming step, step 104 of applying a pulse to the bit line of the selected cell.

The next step then is increment RS and move to the next RS. With this step of incrementing, RS=2 is performed and the RS Count is set to zero. With RS=2, the effect is for signals P and P2 to be at a logic high and signals P1 and P3 to be at a logic low. The source resistance (in this context source resistance is the resistance that is coupled to the commonly-connected sources of the transistors in the memory array) is thus made to be that of resistor 90 plus that of resistor 88. Resistor 90 is preferably significantly more resistive than resistor 88, e.g., 2000 ohms. This resistance is designed to provide sufficient resistance to raise the source voltage so that the typical low threshold voltage devices on bit line 74 are made non-conductive during programming. If the cell was not programmed on the first attempt, it is assumed that there are then low threshold voltage transistors on bit line 74 that provided sufficient current leakage to prevent cell 60 from being successfully programmed. After performing a programming step at RS=2, the next step is to determine if it was successfully programmed. If so, the data is flipped in data buffer 30 and the programming of this cell 60 is completed.

If cell 60 is not sufficiently programmed, then the total programming count is compared to the final count maximum. If yes, then this is considered an error and the device is rejected if at the test level. If the total programming count has not been reached, the next step is to determine if the RS is at the last level. If so, then the next step is to run another programming step at that RS. If no, then the next step is to determine if the maximum number of programming steps at that RS has been performed. If no, which is likely in this case, then the next step is to program the cell again at the same RS level, RS=2. The higher source resistance is for the cells that are slower to program, so it is more likely that the cell will require more than just one programming cycle at that RS level. If, on the other hand, the maximum number of programming cycles for RS=2 has been reached, then the next step is to increment RS to RS=3 and make RS Count=0.

The process of programming in this manner thus continues until either the cell is programmed or the maximum number of programming steps has been performed. The relatively slower approach of using a higher resistance is thus only used when it is necessary to do so. Statistically, a far greater number of cells can be programmed at the lower source resistance, which in this case was found to be about 250 ohms. Thus, the vast majority of the programming can be achieved using the high speed approach. This is especially very significant in test time. If, for example, as has been found, that about 99% can be programmed with just one pulse with the source resistor at the low resistance, then only one percent need more than one pulse. If the higher resistance were used for all of the cells, then programming time for all the cells would go up by a factor of two or more. The result of using the approach of this described embodiment saves about two times in programming test time.

This method was described for the situation in which there are three possible choices for the source resistance. There could also be just two resistance values or there could be more than two. If there are only two, then the method is simplified because it is simpler to keep track of which resistance is being used and how many programming pulses for each resistance are allowed. Two is preferable unless three or more is required. Generally also, a memory cell is defective if it cannot be programmed in three pulses total.

The technique utilized resistors, which do offer some benefits, to obtain the desired bias on the sources of the array transistors. This desired bias, however, could be achieved by another means such as an active biasing circuit. The active bias circuit would provide the source bias at a relatively lower voltage for the first programming attempt then a subsequently higher bias to provide needed programming for those that have the excessive leakage on the bit line.

An alternative for the use of the structure of source control circuits 48–56, for a different programming purpose, is actually to reverse the sequence of source resistance by beginning with higher source resistance and changing to a lower source resistance. This would be for the purpose of tightening the erase distribution.

In the foregoing specification, the invention has been described with reference to specific embodiments. However, one of ordinary skill in the art appreciates that various modifications and changes can be made without departing from the scope of the present invention as set forth in the claims below. For example, the technique for altering the source resistance could be altered by having a single resistor matrix for all of array 11 rather than having a separate source control circuit for each I/O block. As another example, this programming method was discussed in the context of hot carrier injection but could also be used other programming contexts such as in substrate enhanced secondary hot electron injection type programming. As a further example, resistors 88–92 are shown as single resistors but they could, for example, be formed from a plurality of resistors in series. Also, the lowest source resistance described was for 250 ohms but this could be different. It could even be essentially zero by simply being the resistance of a switching device and there be no added resistor. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for programming a non volatile memory cell, the method comprising:

applying a first programming pulse to a drain of a memory cell with a source of the memory cell at a first voltage level;

applying a second programming pulse, after the applying the first programming pulse, to the drain of the memory cell with the source of the memory cell at a second voltage level, the second voltage level different than the first voltage level.

2. The method of claim 1 wherein the second voltage level is greater than the first voltage level.

3. The method of claim 1 wherein:

the applying the first programming pulse with the source of the memory cell at a first voltage level further includes coupling the source to a circuit with a first resistance level;

the applying the second programming pulse with the source of the memory cell at the second voltage level includes coupling the source to a circuit with a second resistance level, the second resistance level is different than the first resistance level.

4. The method of claim 3 wherein the circuit with a first resistance level includes a first resistor circuit, wherein the circuit with the second resistance level includes the first resistor circuit in series with a second resistive circuit.

5. The method of claim 3 wherein the first resistance level is lower than the second resistance level.

6. The method of claim 1 further comprising:

applying a third programming pulse, after the applying the second programming pulse, to the drain of the memory cell with the source of the memory cell at a third voltage level.

7. A method for programming a non-volatile memory cell, the method comprising:

applying a first programming pulse to a drain of a memory cell of a plurality memory cells with a source of the memory cell at a first voltage level if a state of the memory cell is determined not to be at a desired programmed level;

determining whether to apply a second programming pulse to the drain of the memory cell with the source of the memory cell at the second voltage level after the applying the first programming pulse;

applying the second programming pulse, after the applying the first programming pulse, to the drain of the memory cell with the source of the memory cell at the second voltage level if it is determined in the determining to apply a programming pulse to the drain of the memory cell with the source of the memory cell at the second voltage level, wherein the second voltage level is different than the first voltage level.

8. The method of claim 7 wherein the determining whether to apply the second programming pulse to the drain further includes determining whether the state of the memory cell is at a desired programmed level, wherein the second programming pulse is not applied if the state of the memory cell is determined to be at a desired programmed level.

9. The method of claim 7 wherein the determining whether to apply the second programming pulse to the drain further includes determining whether a predetermined number of programming pulses have been applied to the drain with the source of the memory cell at the first voltage level.

10. The method of claim 9 further comprising:
applying a third programming pulse, after the applying the second programming pulse, to the drain of the memory cell with the source of the memory cell at the first voltage level if it is determined in the determining that a predetermined number of programming pulses have not been applied to the drain with the source of the memory cell at the first voltage level and if a state of the memory cell is not at the desired programmed level.

11. The method of claim 7 wherein the determining whether to apply a programming pulse to the drain further includes determining whether a predetermined number of programming pulses have been applied to the drain of the memory cell, wherein the second programming pulse is not applied if the predetermined number of program pulses have been applied to the drain of the memory cell.

12. The method of claim 7 further comprising:
determining whether to apply a third programming pulse to the drain of the memory cell with the source of the memory cell at a third voltage level after the applying the second programming pulse;
applying a third programming pulse, after the applying the second programming pulse, to the drain of the memory cell with the source of the memory cell at the third voltage level if it is determined in the determining to apply the third programming pulse to the drain with the source of the memory cell at the third voltage level, wherein the third voltage level is different than the first voltage level and the second voltage level.

13. The method of claim 7 wherein:
the applying the first programming pulse to the drain of the memory with the source of the memory cell at the first voltage level further includes coupling the source to a circuit with a first resistance level;
the applying the second programming pulse to the drain of the memory with the source of the memory cell at the second voltage level includes coupling the source to a circuit with a second resistance level, the second resistance level is different than the first resistance level.

14. The method of claim 13 wherein the first resistance level is a negligible resistance level.

15. The method of claim 13 wherein the circuit with a first resistance level includes a first resistor circuit, wherein the circuit with the second resistance level includes the first resistor circuit in series with a second resistive circuit.

16. The method of claim 13 wherein the first resistance level is lower than the second resistance level.

17. The method of claim 13 wherein the second resistance level is lower than the first resistance level.

18. The method of claim 7 wherein the first voltage level is greater than the second voltage level.

19. The method of claim 7 wherein the second voltage level is greater than the first voltage level.

20. The method of claim 7 wherein the first programming pulse and the second programming pulse are hot carrier injection programming pulse.

21. The method of claim 7 wherein each memory cell of the plurality is one of a floating gate memory cell and a thin film memory cell.

22. A memory comprising:
a memory array including a plurality of memory cells;
a source bias circuit coupled to sources of the memory cells of the plurality of memory cells, the source bias circuit configured to provide any one of a plurality of source bias voltages to the sources of the memory cells of the plurality of memory cells during a programming pulse applied to a drain of a memory cell of the plurality of memory cells being programmed, the source bias circuit being responsive to at least one voltage control signal to provide a desired source bias voltage of the plurality of source bias voltages, as indicated by the at least one voltage control signal, to the sources of the memory cells of the plurality of memory cells during the programming pulse applied to a drain of a memory cell of the plurality of memory cells;
wherein the source bias circuit is configured to provide a current path with any one of a plurality of resistance levels during the programming pulse applied to a drain of a memory cell of the plurality of memory cells being programmed, wherein the source bias circuit being responsive to the at least one voltage control signal to provide a current path with a desired resistance level, as indicated by the at least one voltage control signal, during a programming pulse applied to a drain of a memory cell of the plurality of memory cells.

23. The memory of claim 22 further comprising:
a first resistive circuit;
a second resistive circuit;
wherein when the source bias circuit provides the current path with a first resistance level of the plurality of resistance levels, the first resistive circuit and the second resistive circuit are par of the current path;
wherein when the source bias circuit provides a current path with a second resistance level of the plurality of resistance levels, the first resistive circuit, but not the second resistive circuit, is part of the circuit path.

24. The memory of claim 23 wherein the first resistive circuit is coupled to the sources of the memory cells of the plurality of memory cells and is in series with the second resistive circuit when the source bias circuit provides the current path with the first resistance level during the programming pulse applied to the drain of a memory cell of the plurality of memory cells.

25. The memory of claim 22 wherein the source bias circuit further includes:
a first switch having a first current terminal coupled to the sources of the memory cells of the plurality of memory cells, the first switch having a control terminal and a second current terminal, wherein the control terminal is responsive to a signal for making the switch conductive to conduct current from the programming pulse during the programming pulse applied to a drain of a memory cell of the plurality of memory cells; and
a least one resistor circuit coupled to the second current terminal.

26. The memory of claim wherein:
the memory array includes a second plurality of memory cells;
wherein the source bias circuit is configured to provide a second current path with any one of a plurality of resistance levels during the programming pulse applied to a drain of a memory cell of the second plurality of memory cells being programmed, wherein the source bias circuit is responsive to provide the second current path with a desired resistance level, as indicated by at least one voltage control signal, during the programming pulse applied to a drain of a memory cell of the second plurality of memory cells.

27. The memory of claim 22 wherein each memory cell of the plurality of memory cells is one of a floating gate memory cell and a thin film memory cell.

28. A memory comprising:

a memory array including a plurality of memory cells;

a source bias circuit coupled to sources of the memory cells of the plurality of memory cells, the source bias circuit configured to provide any one of a plurality of source bias voltages to the sources of the memory cells of the plurality of memory cells during a programming pulse applied to a drain of a memory cell of the plurality of memory cells being programmed, the source bias circuit being responsive to at least one voltage control signal to provide a desired source bias voltage of the plurality of source bias voltages, as indicated by the at least one voltage control signal, to the sources of the memory cells of the plurality of memory cells during a programming pulse applied to a drain of a memory cell of the plurality of memory cells; and a controller having at least one output to provide the at least one voltage control signal, wherein the controller provides an indication via the at least one voltage control signal to the source bias circuit to provide a different source voltage of the plurality of source voltages during a subsequent programming pulse applied to a memory cell of the plurality of memory cells from a source voltage of the plurality of source voltages that was provided during a previous programming pulse applied to the memory cell.

29. The memory of claim 28 further comprising:

a sense amplifier coupled to the controller;

a data buffer coupled to the controller;

wherein the controller provides the at least one voltage control signal to the source bias circuit to provide the different source voltage of the plurality of source voltages in response to a determination that a state of the memory cell is not at a desired programmed level as read by the sense amplifier.

* * * * *

UNITED STATES PATENT AND TRADEMARK OFFICE
CERTIFICATE OF CORRECTION

PATENT NO. : 6,909,638 B2  Page 1 of 1
APPLICATION NO. : 10/426282
DATED : June 21, 2005
INVENTOR(S) : Jon S. Choy It is certified that error appears in the above-identified patent and that said Letters Patent is hereby corrected as shown below:

In Column 8, Line 38, Claim No. 22:

Change "par" to --part--

Signed and Sealed this

Second Day of January, 2007

JON W. DUDAS
*Director of the United States Patent and Trademark Office*